US010580952B2

(12) United States Patent
Maki et al.

(10) Patent No.: US 10,580,952 B2
(45) Date of Patent: Mar. 3, 2020

(54) LIGHT-EMITTING DEVICE, INFRARED LIGHT SOURCE, AND METHOD FOR MANUFACTURING LIGHT-EMITTING DEVICE

(71) Applicants: KEIO UNIVERSITY, Minato-ku, Tokyo (JP); HAMAMATSU PHOTONICS K.K., Hamamatsu-shi, Shizuoka (JP)

(72) Inventors: Hideyuki Maki, Yokohama (JP); Motohiro Suyama, Hamamatsu (JP); Takaaki Nagata, Hamamatsu (JP); Takeo Fujii, Hamamatsu (JP)

(73) Assignees: KEIO UNIVERSITY, Minato-ku, Tokyo (JP); HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 16/162,656

(22) Filed: Oct. 17, 2018

(65) Prior Publication Data
US 2019/0123254 A1   Apr. 25, 2019

(30) Foreign Application Priority Data
Oct. 19, 2017 (JP) .................. 2017-202550

(51) Int. Cl.
*H01L 33/64* (2010.01)
*H01L 33/00* (2010.01)
(Continued)

(52) U.S. Cl.
CPC ........ *H01L 33/641* (2013.01); *H01L 33/0054* (2013.01); *H01L 33/36* (2013.01);
(Continued)

(58) Field of Classification Search
CPC ............ H01L 33/36; H01L 2933/0075; H01L 2933/0016
See application file for complete search history.

(56) References Cited

U.S. PATENT DOCUMENTS

| 2015/0228859 A1* | 8/2015 | Morreale | H01L 51/5296 257/29 |
| 2016/0164038 A1* | 6/2016 | Shin | H01L 51/5268 257/40 |
| 2017/0117443 A1* | 4/2017 | Kim | H01L 33/483 |

FOREIGN PATENT DOCUMENTS

| JP | 2014-67544 A | 4/2014 |
| JP | 6155012 B2 | 6/2017 |
| WO | WO-2013/090774 A2 | 6/2013 |

* cited by examiner

*Primary Examiner* — Jay C Chang
*Assistant Examiner* — Mikka Liu
(74) *Attorney, Agent, or Firm* — Drinker Biddle & Reath LLP

(57) ABSTRACT

A light-emitting device according to one embodiment includes: a substrate; a graphite thin film disposed on the substrate; and an electrode provided on a second surface of the graphite thin film on an edge portion of the graphite thin film, the second surface of the graphite thin film being opposite from a first surface of the graphite thin film, the first surface of the graphite thin film opposed to the substrate. A plurality of protrusions for supporting the graphite thin film is formed on a surface of the substrate opposed to the graphite thin film, at least over an entire region where the substrate and a portion of the graphite thin film other than the edge portion overlap each other when viewed along a thickness direction of the substrate.

20 Claims, 12 Drawing Sheets

(51) Int. Cl.
*H01L 33/36* (2010.01)
*H01L 33/40* (2010.01)
(52) U.S. Cl.
CPC ...... *H01L 33/40* (2013.01); *H01L 2933/0016* (2013.01); *H01L 2933/0075* (2013.01)

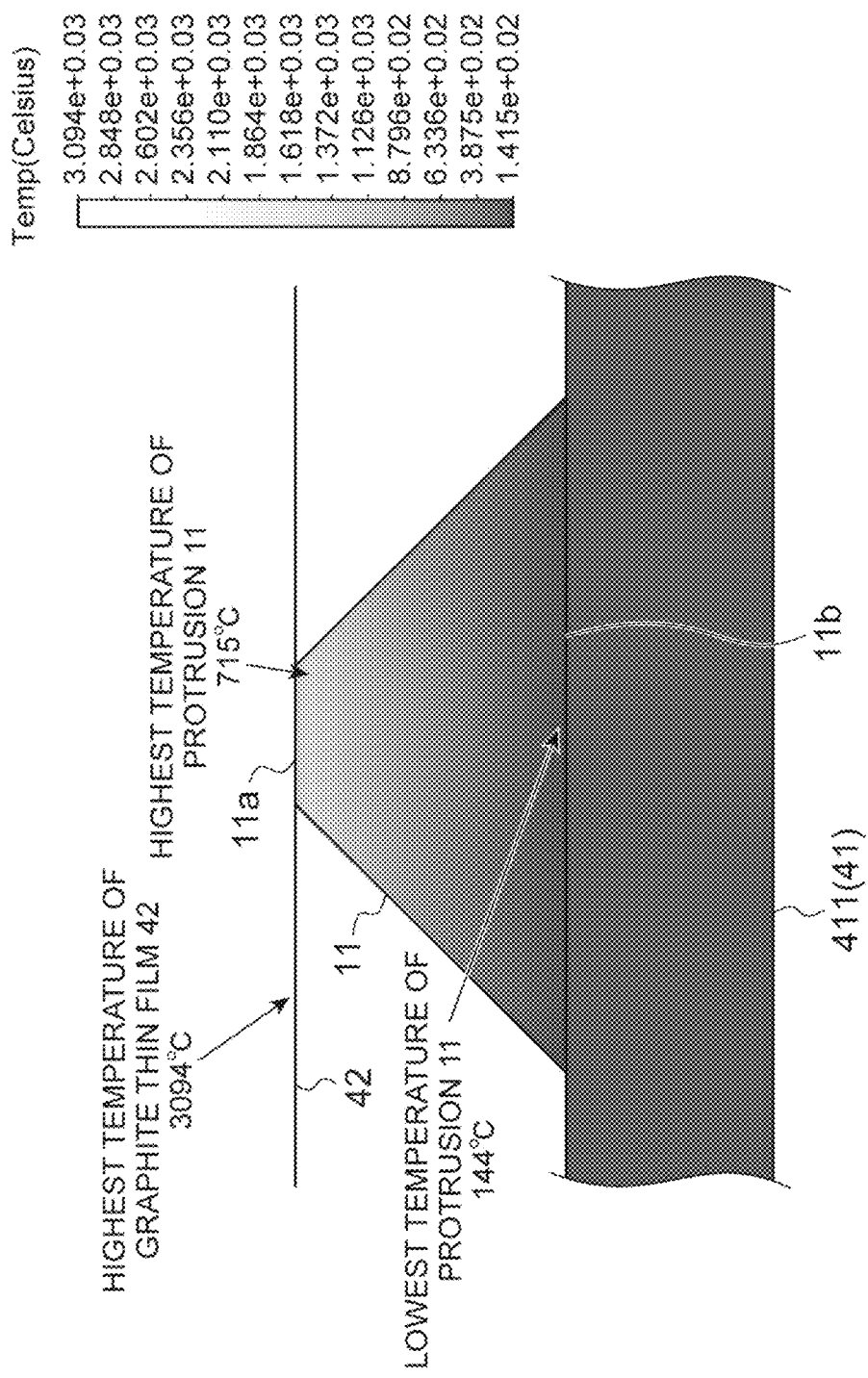

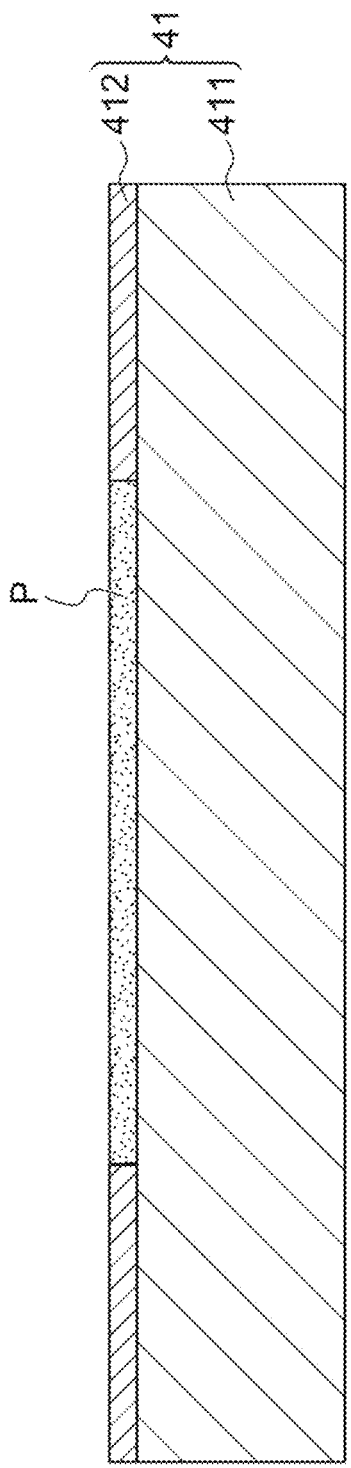
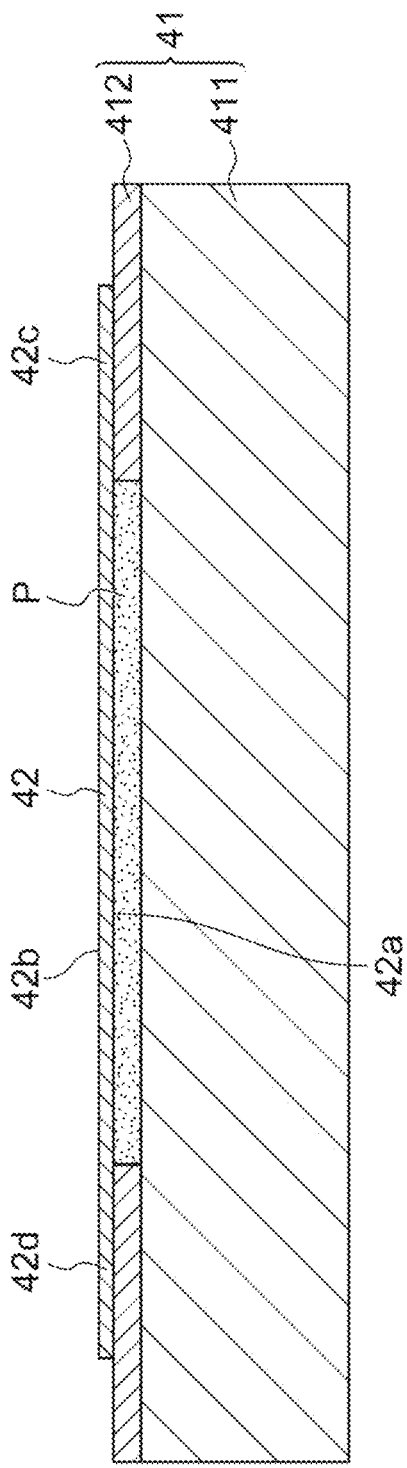

LIGHT-EMITTING DEVICE, INFRARED LIGHT SOURCE, AND METHOD FOR MANUFACTURING LIGHT-EMITTING DEVICE

TECHNICAL FIELD

The present disclosure relates to a light-emitting device, an infrared light source, and a method for manufacturing the light-emitting device.

BACKGROUND

A light source with a light-emitting device using a graphite thin film (e.g., single-layer or multilayer of graphene) is known as an infrared light source (see Patent Literatures 1 to 3).

SUMMARY

In the structure described in Patent Literature 1 (Japanese Patent No. 6155012), since the entire area of one surface of the graphite thin film is in contact with the insulating film on the substrate surface, the thermal conduction (heat dissipation) from the graphite thin film to the substrate is pronounced. There is therefore room for improvement in brightness achieved by efficiently heating the graphite thin film. Besides, in the above-described structure, there is a risk of damage to the substrate due to heat from the graphite thin film. On the other hand, in the structure in which the edge portion of the graphite thin film is supported by a pair of current terminals described in Patent Literature 2 (Japanese Unexamined Patent Publication No. 2014-67544), the thermal conduction from the graphite thin film to the substrate can possibly be suppressed, although such a structure can barely stably support the graphite thin film. Especially in the case of a long graphite thin film, the graphite thin film is unstably supported. Thus, in the structure described in Patent Literatures 1 and 2, it is difficult to stably support the graphite thin film while suppressing the thermal conduction from the graphite thin film to the substrate. Patent Literature 3 (International Publication No. WO2013/090774) does not disclose any structure for solving such a problem neither.

For this reason, an object of the present disclosure is to provide a light-emitting device, an infrared light source, and a method for manufacturing the light-emitting device that can stably support a graphite thin film while suppressing the thermal conduction from the graphite thin film to a substrate.

A light-emitting device according to one aspect of the present invention comprises: a substrate; a graphite thin film disposed on the substrate; and an electrode provided on a second surface of the graphite thin film on an edge portion of the graphite thin film, the second surface of the graphite thin film being opposite from a first surface of the graphite thin film, the first surface of the graphite thin film opposed to the substrate. The plurality of protrusions for supporting the graphite thin film is formed on a surface of the substrate opposed to the graphite thin film, at least over an entire region where the substrate and a portion of the graphite thin film other than the edge portion overlap each other when viewed along a thickness direction of the substrate.

In the light-emitting device according to one aspect of the present invention, the plurality of protrusions for supporting the graphite thin film is formed over the entire region where the substrate and the central portion of the graphite thin film (the portion other than the edge portion) overlap each other. The central portion of the graphite thin film is supported in a plurality of locations by the plurality of protrusions, so that the graphite thin film is stably supported with respect to the substrate. In addition, since the graphite thin film is partially in contact with the plurality of protrusions, the thermal conduction from the graphite thin film to the substrate is suppressed. Thus, in the above-described light-emitting device, the graphite thin film can be stably supported while the thermal conduction from the graphite thin film to the substrate is suppressed.

A portion of each protrusion in contact with the graphite thin film may have insulating properties. In this case, the leakage current from the graphite thin film to the substrate is suppressed, thereby efficiently heating the graphite thin film only.

The protrusions may be provided in a region where the substrate and the graphite thin film overlap each other when viewed along the thickness direction of the substrate. In this case, thermal insulation between the graphite thin film and the substrate can be achieved over the entire area of the first surface of the graphite thin film. Thus, the thermal conduction from the graphite thin film to the substrate can be more effectively suppressed.

The protrusions may not be provided in a region where the substrate and the electrode overlap each other when viewed along the thickness direction of the substrate. In this case where the protrusions are not provided in a region where the substrate and the electrode overlap each other when viewed along the thickness direction of the substrate, the thermal conduction from a portion of the graphite thin film overlapping the electrode to the substrate is not suppressed by the protrusions. Hence, the heat of the portion of the graphite thin film overlapping the electrode can be efficiently released to the substrate, thereby suppressing a phenomenon in which the portion of the graphite thin film overlapping the electrode reaches high temperatures. Consequently, the damage to the electrode due to heat from the portion of the graphite thin film overlapping the electrode can be suppressed.

A level of a portion of each protrusion in contact with the graphite thin film may be flush with a level of a portion of the surface of the substrate opposed to the graphite thin film, where the protrusions are not formed. With this configuration, the graphite thin film can be supported flat even when the graphite thin film is provided across both the portion in which the protrusions are formed and the portion in which the protrusions are not formed. This can suppress the warpage of the graphite thin film and the damage to the graphite thin film.

The substrate may include a substrate member and an insulating layer provided on a surface of the substrate member opposed to the graphite thin film, and the protrusions may be formed on the insulating layer. With this configuration, the protrusions can be formed by performing fine processing on the insulating layer provided on the substrate member.

The substrate member may be composed of silicon, and the insulating layer may be composed of silicon dioxide. With this configuration, the fine processing of silicon dioxide (the insulating layer) formed on the surface of silicon (the substrate member) allows the protrusions to be formed in a relatively easy process.

A contact area between the protrusions and the graphite thin film may be smaller than a contact area between the protrusions and the substrate member. The larger the contact area between the protrusions and the substrate member, the more stably the protrusions can be supported with respect to the substrate member. Further, the smaller the contact area between the protrusions and the graphite thin film, the more the thermal conduction from the graphite thin film to the protrusions can be suppressed and the more effectively the thermal conduction to the substrate member through the protrusions can be suppressed.

Each protrusion may have a columnar shape. With this configuration, the plurality of columnar protrusions enables a structure in which the graphite thin film is supported partially and stably in a plurality of locations.

The plurality of protrusions may include a plurality of walls arranged in one direction. In this case, the graphite thin film can be supported more stably while the thermal conduction from the graphite thin film to the substrate is suppressed by partially supporting the graphite thin film with the plurality of walls.

A surface of each protrusion opposed to the graphite thin film may have a fine structure portion having a fine uneven structure. With this configuration, the fine structure portion formed on the surface of the protrusion leads to a further reduction in the contact area between the graphite thin film and the protrusion, thereby suppressing the thermal conduction from the graphite thin film to the substrate more effectively.

The graphite thin film may be a single layer or multilayer of graphene. In particular, the graphite thin film may be a multilayer of graphene with 100 to 2000 layers. It is preferable to use a larger number of layers in the graphite thin film in order to improve the emission intensity. On the other hand, from the viewpoint of improving the thermal response rate, to lower the heat capacity of the graphite thin film, it is preferable to use a smaller number of layers in the graphite thin film. Use of 100 to 2000 layers in the graphite thin film leads to the light-emitting device that is favorable in the above viewpoints.

The graphite thin film may have a rectangular shape when viewed along the thickness direction of the substrate, and a long side of the graphite thin film may have a length of greater than or equal to 100 μm. The graphite thin film is very thin and flexible. For this reason, for example, when a crosslinked structure for supporting two points at the both ends of the long graphite thin film is employed, the central portion of the graphite thin film is largely bent and may thus be damaged. On the other hand, in the light-emitting device, the graphite thin film is supported in a plurality of locations by the plurality of protrusions, thereby suppressing the damage to the graphite thin film which may occur when the above-described crosslinked structure is employed. Thus, the graphite thin film can be made long. Further, use of the long graphite thin film the long side of which has a length of greater than or equal to 100 μm improves flexibility in the design of the light-emitting device.

A light-emitting device according to another aspect of the present invention comprises: a substrate; a graphite thin film disposed on the substrate; an electrode provided on a second surface of the graphite thin film on an edge portion of the graphite thin film, the second surface of the graphite thin film being opposite from a first surface of the graphite thin film, the first surface of the graphite thin film opposed to the substrate; and a covering layer having a porous structure, the covering layer being provided on a surface of the substrate opposed to the graphite thin film, at least on a region where the substrate and a portion of the graphite thin film other than the edge portion overlap each other when viewed along a thickness direction of the substrate.

In the light-emitting device according to another aspect of the present invention, at least the central portion of the graphite thin film (the portion other than the edge portion) is supported by the covering layer. Thus, the graphite thin film is stably supported with respect to the substrate. In addition, the covering layer has a porous structure, so that the thermal conduction from the graphite thin film to the substrate through the covering layer is suppressed. Thus, in the above-described light-emitting device, the graphite thin film can be stably supported while the thermal conduction from the graphite thin film to the substrate is suppressed.

An infrared light source according to one aspect of the present invention comprises: a package including a light transmitting window and defining an internal space held in a vacuum state; a stem disposed in the package; and a light-emitting device disposed on the stem. The light-emitting device includes a substrate, a graphite thin film disposed on the substrate, and an electrode provided on a second surface of the graphite thin film on an edge portion of the graphite thin film, the second surface of the graphite thin film being opposite from a first surface of the graphite thin film, the first surface of the graphite thin film opposed to the substrate. A plurality of protrusions for supporting the graphite thin film is formed on a surface of the substrate opposed to the graphite thin film, at least over an entire region where the substrate and a portion of the graphite thin film other than the edge portion overlap each other when viewed along a thickness direction of the substrate. Light emitted from the graphite thin film is emitted to the outside of the package through the light transmitting window.

The infrared light source according to one aspect of the present invention includes the light-emitting device having the above-mentioned advantageous effects. Thus, with this infrared light source, in the light-emitting device, the graphite thin film can be stably supported while the thermal conduction from the graphite thin film to the substrate is suppressed.

An infrared light source according to another aspect of the present invention comprises: a package including a light transmitting window and defining an internal space held in a vacuum state; a stem disposed in the package; and a light-emitting device disposed on the stem. The light-emitting device includes a substrate, a graphite thin film disposed on the substrate, an electrode provided on a second surface of the graphite thin film on an edge portion of the graphite thin film, the second surface of the graphite thin film being opposite from a first surface of the graphite thin film, the first surface of the graphite thin film opposed to the substrate, and a covering layer having a porous structure and being provided on a surface of the substrate opposed to the graphite thin film, at least on a region where the substrate and a portion of the graphite thin film other than the edge portion overlap each other when viewed along a thickness direction of the substrate. Light emitted from the graphite thin film is emitted to the outside of the package through the light transmitting window.

An infrared light source according to another aspect of the present invention includes the light-emitting device having the above-mentioned advantageous effects. Thus, with this infrared light source, in the light-emitting device, the graphite thin film can be stably supported while the thermal conduction from the graphite thin film to the substrate is suppressed.

A method for manufacturing a light-emitting device according to one aspect of the present invention comprises: a preparation step of preparing a substrate; a formation step of forming a plurality of protrusions at least on a region of a surface of the substrate; a placement step of disposing a graphite thin film on the substrate in such a manner that at least a portion of a first surface of the graphite thin film other than an edge portion of the graphite thin film comes in contact with the plurality of protrusions; and an electrode forming step of forming an electrode on a second surface of the graphite thin film opposite from the first surface, on the edge portion of the graphite thin film.

In the method for manufacturing a light-emitting device according to one aspect of the present invention, a plurality of protrusions is formed on at least a region of the surface of the substrate, thereby attaining a structure in which the central portion of the graphite thin film (the portion other than the edge portion) is in contact with the plurality of protrusions. The central portion of the graphite thin film is supported in a plurality of locations by the plurality of protrusions in this way, so that the graphite thin film is stably supported with respect to the substrate. In addition, since the graphite thin film is partially in contact with the plurality of protrusions, the thermal conduction from the graphite thin film to the substrate is suppressed. Thus, the method of manufacturing a light-emitting device produces the light-emitting device in which the graphite thin film can be stably supported while the thermal conduction from the graphite thin film to the substrate is suppressed.

In the method for manufacturing a light-emitting device, the preparation step may include a step of preparing a substrate member, and a step of providing an insulating layer on a surface of the substrate member, and in the formation step, the plurality of protrusions may be for by etching at least a region of the insulating layer. In this case, the protrusions can be formed by a relatively easy process, i.e., etching of the insulating layer provided on the surface of the substrate member.

A method for manufacturing a light-emitting device according to another aspect of the present invention comprises: a preparation step of preparing a substrate; a covering layer forming step of forming a covering layer at least on a region of a surface of the substrate, the covering layer having a porous structure; a placement step of disposing a graphite thin film on the covering layer in such a manner that the covering layer and at least a portion of a first surface of the graphite thin film other than an edge portion of the graphite thin film overlap each other; and an electrode forming step of forming an electrode on a second surface of the graphite thin film opposite from the first surface, on the edge portion of the graphite thin film.

In the method for manufacturing a light-emitting device according to the other aspect of the present invention, the covering layer having a porous structure is formed on at least a region of the surface of the substrate, thereby attaining a structure in which the central portion of the graphite thin film (the portion other than the edge portion) is in contact with the covering layer. Since the central portion of the graphite thin film is supported by the covering layer in this way, the graphite thin film is stably supported with respect to the substrate. In addition, the covering layer has a porous structure, so that the thermal conduction from the graphite thin film to the substrate through the covering layer is suppressed. Thus, the method of manufacturing a light-emitting device produces the light-emitting device in which the graphite thin film can be stably supported while the thermal conduction from the graphite thin film to the substrate is suppressed.

The present disclosure can provide a light-emitting device, an infrared light source, and a method for manufacturing the light-emitting device that can stably support a graphite thin film while suppressing the thermal conduction from the graphite thin film to a substrate.

BRIEF DESCRIPTION OF THE DRAWINGS

FIG. 7 is a diagram showing the simulation results related to the thermal analysis model shown in FIGS. 6A and 6B.

FIGS. 9A and 9B are schematic views showing a process for manufacturing the light-emitting device shown in FIG. 1.

DETAILED DESCRIPTION

Figure 1:
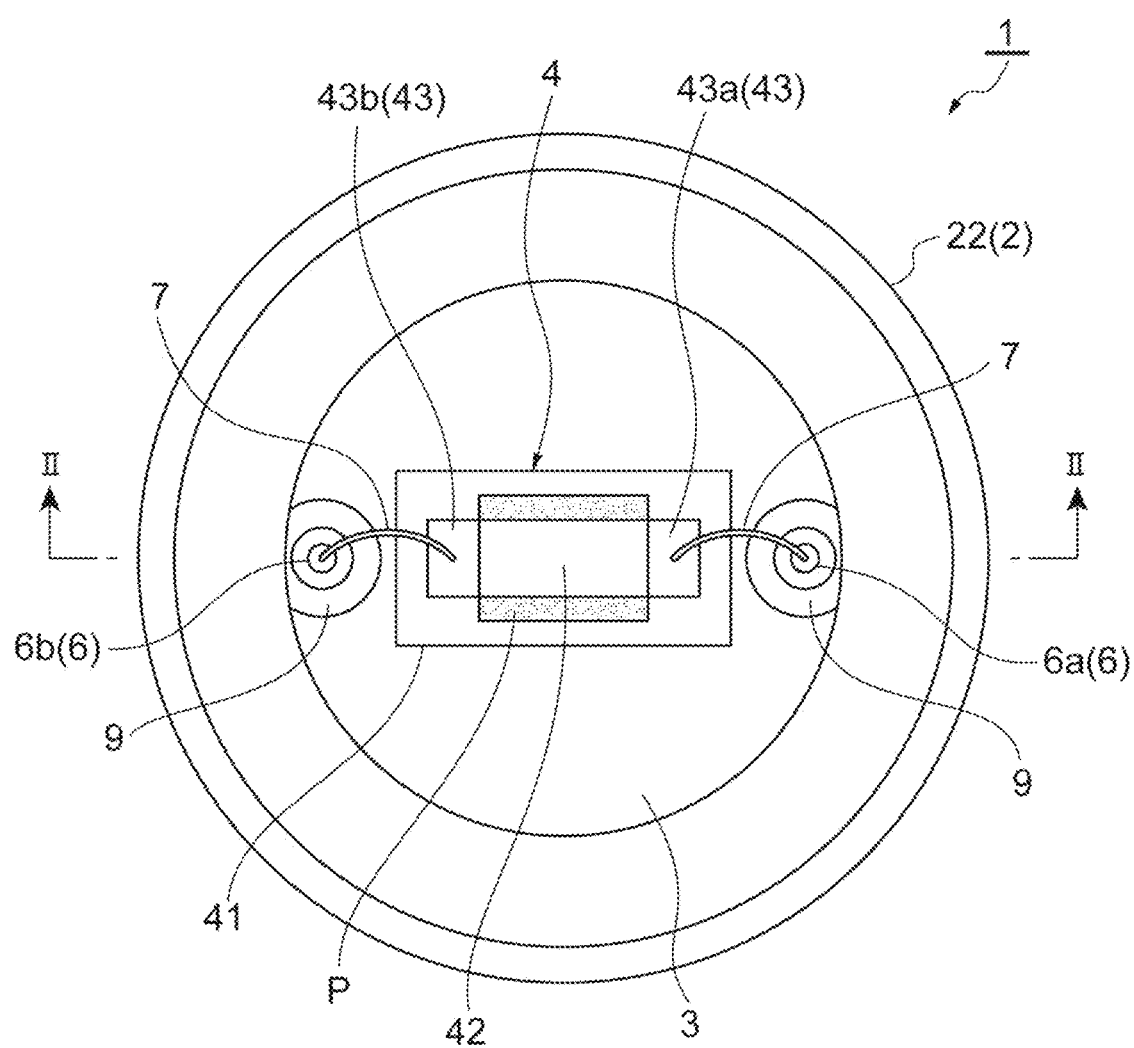
FIG. 1 is a plan view showing an infrared light source including a light-emitting device according to the first embodiment.

Preferred embodiments of the present invention will now be described in detail with reference to the accompanying drawings. Note that in the drawings, the same or corresponding components are denoted by the same reference numeral, and redundant description will be omitted. The dimensions or dimensional ratio of each member (or site) shown in the drawings may be different from the actual dimensions or dimensional ratio so that the description is clarified.

First Embodiment

Figure 2:
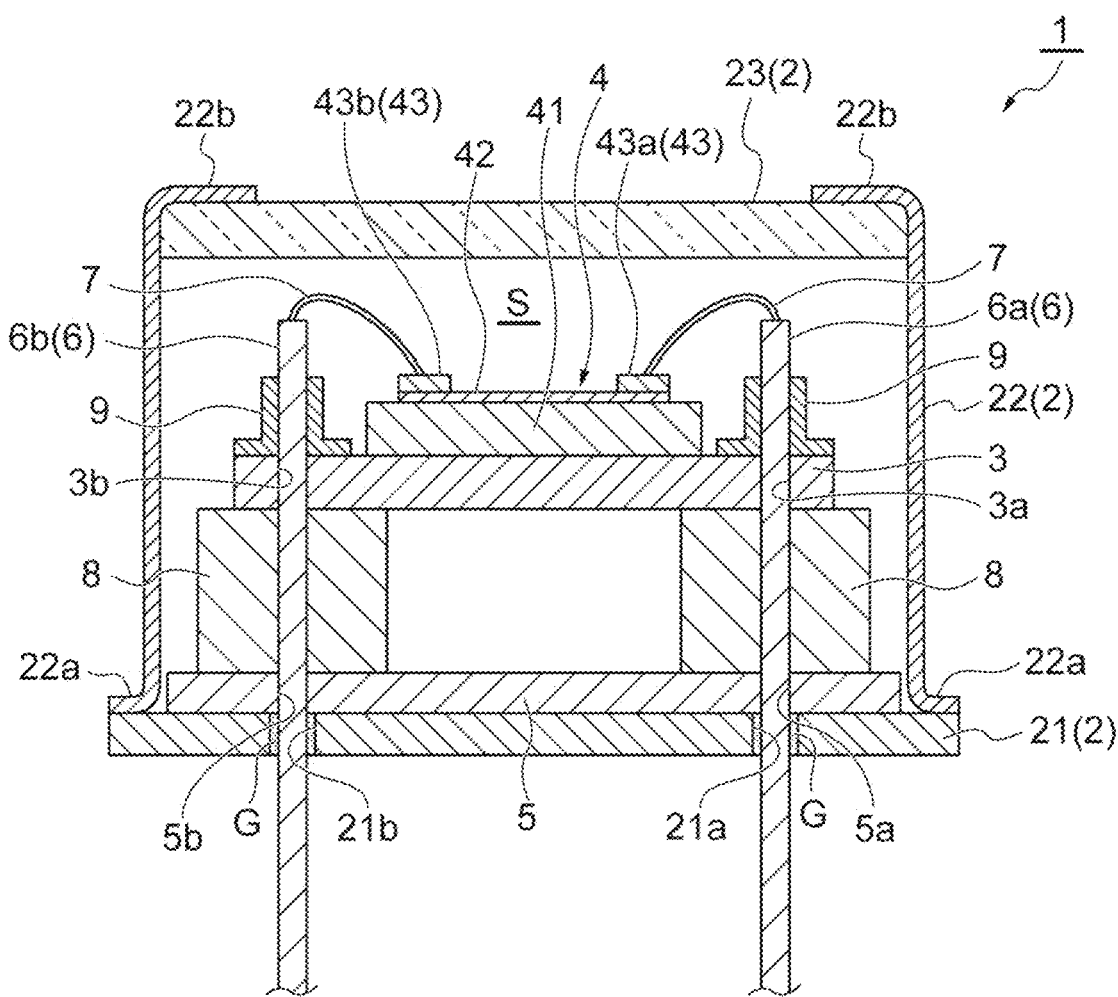
FIG. 2 is a cross-sectional view along line in FIG. 1.

Referring to FIGS. 1 and 2, the configuration of an infrared light source 1 according to the first embodiment will be described. FIG. 1 is a plan view showing the infrared light source 1 including a light-emitting device 4 according to the first embodiment. FIG. 2 is a cross-sectional view along line II-II in FIG. 1. In FIG. 1, a light transmitting window 23, which will be described later, is omitted. As shown in FIGS. 1 and 2, the infrared light source 1 includes a package 2 defining an internal space S which is held in the vacuum state, a stem 3 disposed in the package 2, a light-emitting device 4 disposed on the stem 3, a base plate 5, stem pins 6, bonding wires 7, spacers 8, and eyelets 9. The light-emitting device 4 includes a substrate 41, a graphite thin film 42, and electrodes 43 (a source electrode 43a and a drain electrode 43b).

The package 2 includes a circular plate-like base member 21 composed of, for example, metal, a cylindrical cap 22 composed of, for example, metal, and a light transmitting window 23. The base member 21 and the cap 22 are closely bonded to each other in the state where an edge portion of the base member 21 is in contact with a ring-shaped flange portion 22a of the cap 22, which extends outward along the base member 21. The cap 22 has a ring-shaped flange portion 22b, which extends inward, at the upper end (the opposite end from the flange portion 22a).

The light transmitting window 23 has a circular plate shape. The light transmitting window 23 is composed of, for example, a high infrared transmittance material, such as CaF2 (calcium fluoride). The light transmitting window 23 is fixed to the cap 22, being in contact with the flange portion 22b of the cap 22 and closely bonded to the inner surface of the upper end of the cap 22. It should be noted that the light transmitting window 23 may be provided outside the cap 22. In other words, the light transmitting window 23 may be closely bonded to the upper surface of the flange portion 22b of the cap 22. Since the base member 21, the cap 22, and light transmitting window 23 are closely bonded to each other as described above, the internal space S which is held in the vacuum state is defined inside the package 2. The inner surface (the surface adjacent to the internal space S) of the base member 21 is bonded to a base plate 5 which is a metal circular plate slightly smaller than the base member 21.

The stem 3 is a circular plate-like member slightly smaller than the base plate 5. The stem 3 is composed of, for example, a ceramic material. The stem 3, the base plate 5, and the base member 21 have a through hole 3a, a through hole 5a, and a through hole 21a through which a stem pin 6a is inserted, and a through hole 3b, a through hole 5b, and a through hole 21b through which a stem pin 6b is inserted. The through hole 3a, the through hole 5a, and the through hole 21a are formed in a position in which they overlap each other in the thickness direction of the stem 3. The through hole 3b, the through hole 5b, and the through hole 21b are formed in a position in which they overlap each other in the thickness direction of the stem 3. The through holes through which the stem pin 6a is inserted (the through hole 3a, the through hole 5a, and the through hole 21a) and the through holes through which the stem pin 6b is inserted (the through hole 3b, the through hole 5b, and the through hole 21b) are opposed to each other in the direction in which the source electrode 43a and the drain electrode 43b are opposed to each other. To be specific, when viewed along the thickness direction of the stem 3, the through hole 3a, the through hole 5a, and the through hole 21a are located outer than the source electrode 43a, and the through hole 3b, the through hole 5b, and the through hole 21b are located outer than the drain electrode 43b. In other words, when viewed along the thickness direction of the stem 3, the stem pin 6a is located outer than the source electrode 43a, and the stem pin 6b is located outer than the drain electrode 43b.

Each stem pin 6 is a conductive member. Each stem pin 6 is composed of, for example, a Kovar metal plated with nickel (1 to 10 μm), gold (0.1 to 2 μm), and the like. Each stem pin 6 extends in the thickness direction of the stem 3. Each stem pin 6 and the through holes 21a and 21b of the base member 21 are closely bonded to each other through, for example, a sealing member G composed of a low-melting glass. A portion of each stem pin 6 which extends out from the stem 3 and the stem 3 are fixed to each other through the eyelet 9. Hence, each stem pin 6 is fixed to the stem 3. A portion of the stem pin 6a extending out from the package 2 is connected to an external power supply (not shown in the drawing) or the like. On the other hand, a portion of the stem pin 6a extending out from the stem 3 (in this embodiment, the tip of the stem pin 6a) is electrically connected to the source electrode 43a through the bonding wire 7. Hence, an electrical conduction is ensured between the source electrode 43a and the external power supply. Similarly, a portion of the stem pin 6b extending out from the package 2 is connected to the external power supply (not shown in the drawing) or the like. On the other hand, a portion of the stem pin 6b extending out from the stem 3 (in this embodiment, the tip of the stem pin 6b) is electrically connected to the drain electrode 43b through the bonding wire 7. Hence, an electrical conduction is ensured between the drain electrode 43b and the external power supply.

A cylindrical spacer 8 is disposed between the stem 3 and the base plate 5 so as to cover the periphery of each stem pin 6. The spacer 8 is composed of, for example, a ceramic material. With the spacer 8, the stem 3 is disposed in a position apart from the base plate 5.

The light-emitting device 4 is fixed to the stein 3 in such a manner that the surface of the substrate 41 opposite from that provided with the graphite thin film 42 is fixed to the upper surface of the stem 3 by die bonding or the like. Light emitted from the graphite thin film 42 upon application of a voltage to the graphite thin film 42 of the light-emitting device 4 through the electrodes 43 is emitted to the outside of the package 2 through the light transmitting window 23.

It should be noted that the configuration of the infrared light source 1 is not limited to the above-described configuration. For example, although, in the infrared light source 1, the stem 3 is fixed through the two stem pins 6a and 6b opposed each other in the direction in which the source electrode 43a and the drain electrode 43b are opposed to each other, three or more stem pins may be inserted through the stem 3, the base plate 5, and the base member 21 so that the stem 3 can be fixed more stably.

Figure 3:
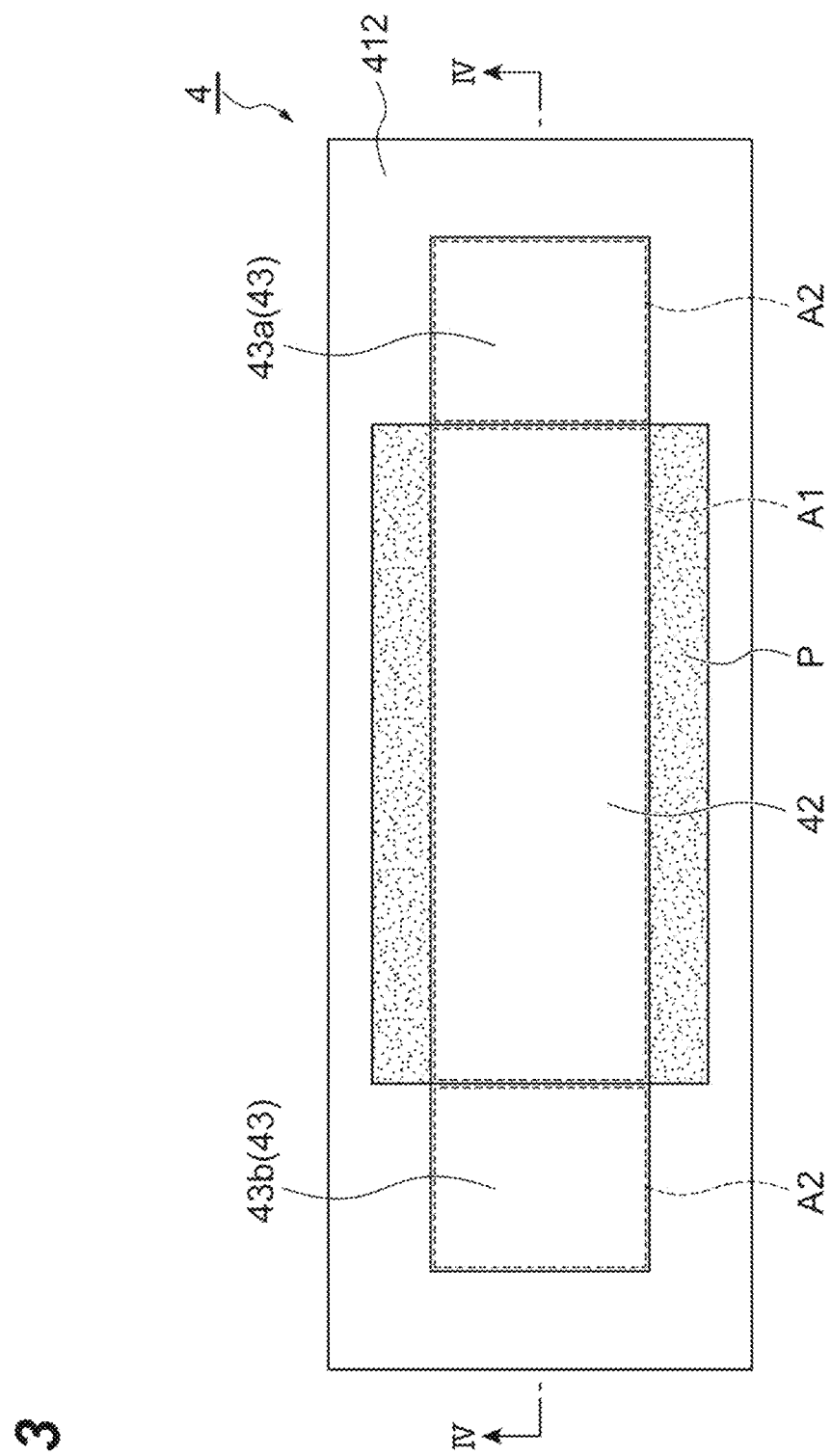
FIG. 3 is a plan view showing the light-emitting device shown in FIG. 1.
Figure 4:
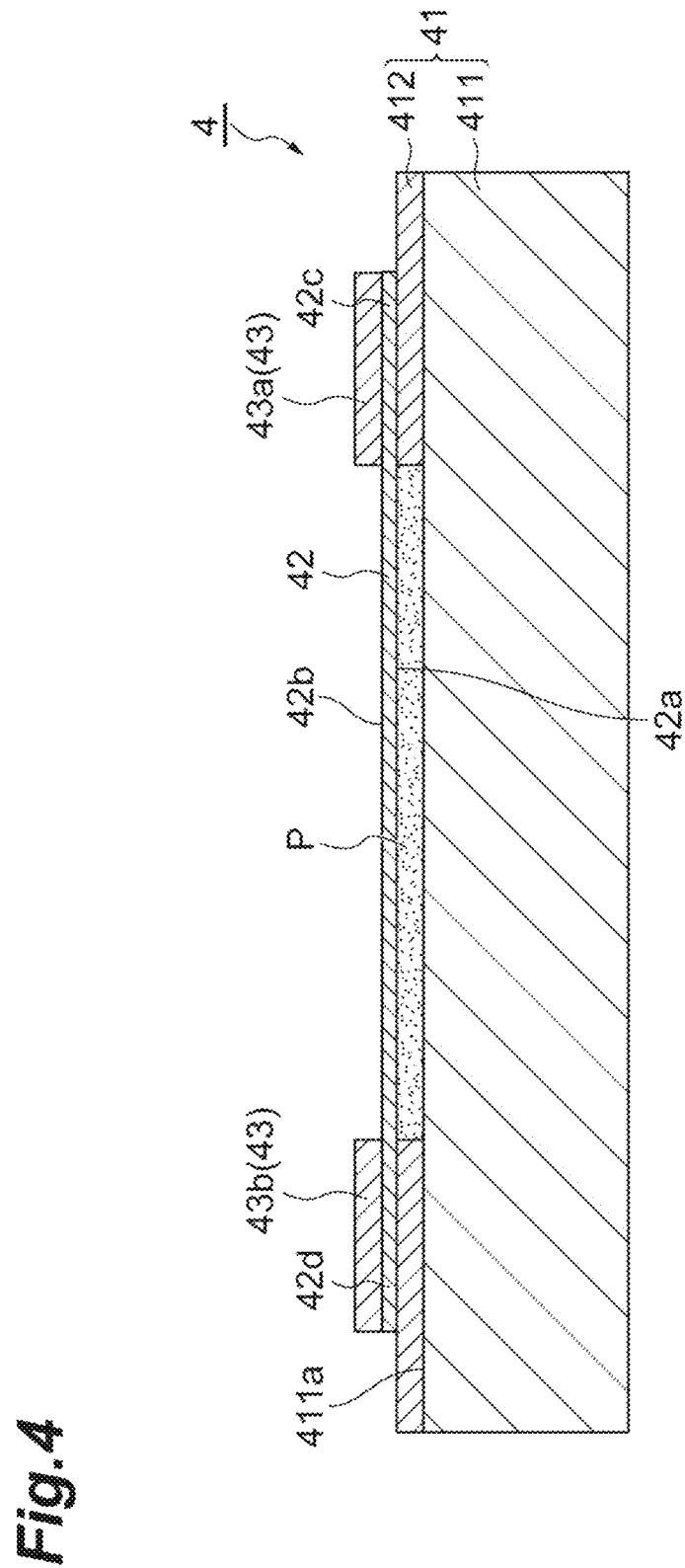
FIG. 4 is a cross-sectional view along line IV-IV in FIG. 3.

Referring to FIGS. 3 and 4, the configuration of the light-emitting device 4 according to this embodiment will be described. FIG. 3 is a plan view of the light-emitting device 4. FIG. 4 is a cross-sectional view along line IV-IV in FIG. 3. As shown in FIGS. 3 and 4, the light-emitting device 4 includes a substrate 41, a graphite thin film 42 disposed on the substrate 41, and the electrodes 43 (the source electrode 43a and the drain electrode 43b) provided to the edge portions 42c and 42d of the graphite thin film 42 when viewed along the thickness direction of the substrate 41.

The substrate 41 has a rectangular plate shape. In this embodiment, the substrate 41 includes a rectangular plate-like substrate member 411 and an insulating layer 412 provided on the surface 411a of the substrate member 411 which is opposed to the graphite thin film 42.

The substrate member 411 is a silicon substrate composed of silicon (Si). The substrate member 411 has a thickness of about 600 μm, for example. Note that the substrate member 411 may be composed of any material, such as SiN, SiC, Al2O3, or MgO, that has an electrical resistance sufficiently higher than that of the graphite thin film 42 and cannot be electrically shorted between the source electrode 43a and the drain electrode 43b. The insulating layer 412 is composed of silicon dioxide (SiO2). The insulating layer 412 is coated on the surface 411a of the substrate member 411. The insulating layer 412 has a thickness of about 2 μm, for example.

The graphite thin film 42 has a rectangular shape (for example, 100 μm (short side) by 200 μm (long side)) slightly smaller than the substrate 41 when viewed along the thickness direction of the substrate 41, and is disposed in the central portion of the substrate 41. The graphite thin film 42 is a single layer or multilayer of graphene (or graphite) with, for example, 1 to 2000 layers. The thickness of one layer of graphene is about 3.3 Å (0.33 nm). A single layer or multilayer of graphene serving as a material for the graphite thin film 42 can be produced by, for example, transfer from graphite using an adhesive tape or the like, chemical vapor deposition, or SiC heating.

The graphite thin film 42 functions as a light-emitting portion for emitting infrared light by generating heat in response to a voltage applied through the electrodes 43. Here, to improve the emission intensity, it is preferable to use a larger number of layers in the graphite thin film 42. On the other hand, from the viewpoint of improving the thermal response rate, to lower the heat capacity of the graphite thin film 42, it is preferable to use a smaller number of layers in the graphite thin film 42. From the above viewpoints, more preferably, the graphite thin film 42 may be a multilayer of graphene with 100 to 2000 layers. Use of 100 to 2000 layers in the graphite thin film 42 leads to the light-emitting device 4 that is favorable in the above viewpoints.

On the second surface 42b of the graphite thin film 42 opposite from the first surface 42a opposed to the substrate 41, the electrodes 43 are provided on the edge portions 42c and 42d of the graphite thin film 42. In this embodiment, when viewed along the thickness direction of the substrate 41, the rectangular plate-like source electrode 43a is provided on the edge portion 42c along one short side of the graphite thin film 42, and the rectangular plate-like drain electrode 43b is provided on the edge portion 42d along the other short side of the graphite thin film 42. It should be noted that the shape of the electrodes 43 may be a shape other than a rectangular plate shape, for example, a comb shape. Although the entire electrodes 43 are disposed on the graphite thin film 42 in this embodiment, the electrodes 43 may partially extend out from the edge portions 42c and 42d of the graphite thin film 42. In this case, part of the electrodes 43 extending out from the edge portions 42c and 42d of the graphite thin film 42 may be in contact with a surface of the substrate 41 (in this embodiment, a surface of the insulating layer 412). The material for the electrode 43 may be any material that carries current, for example, a metal, such as Pd, Pt, Au, Ni, Co, Cr, Ti, or Al, or a semiconductor. Note that, when high-speed modulation is required in relation to the emission intensity of the graphite thin film 42, it is preferable that the electrodes 43 are composed of a metal with low electrical resistance.

A protrusion formation region P in which a plurality of protrusions for supporting the graphite thin film 42 is formed is provided on the surface of the substrate 41 which is opposed to the graphite thin film 42, at least over the entire region A1 in which the substrate 41 and the portion of the graphite thin film 42 other than the edge portions 42c and 42d overlap each other when viewed along the thickness direction of the substrate 41. In this embodiment, the insulating layer 412 corresponds to the "surface of the substrate 41 which is opposed to the graphite thin film 42". In the protrusion formation region P, a plurality of protrusions (which will be described later) for supporting the central portion of the graphite thin film 42 (the portion other than the edge portions 42c and 42d) is formed. When viewed from the thickness direction of the substrate 41, the protrusion formation region P is provided in such a manner that it covers the region A1, but not provided in the region A2 in which the electrodes 43 and the substrate 41 overlap each other.

Figure 5:
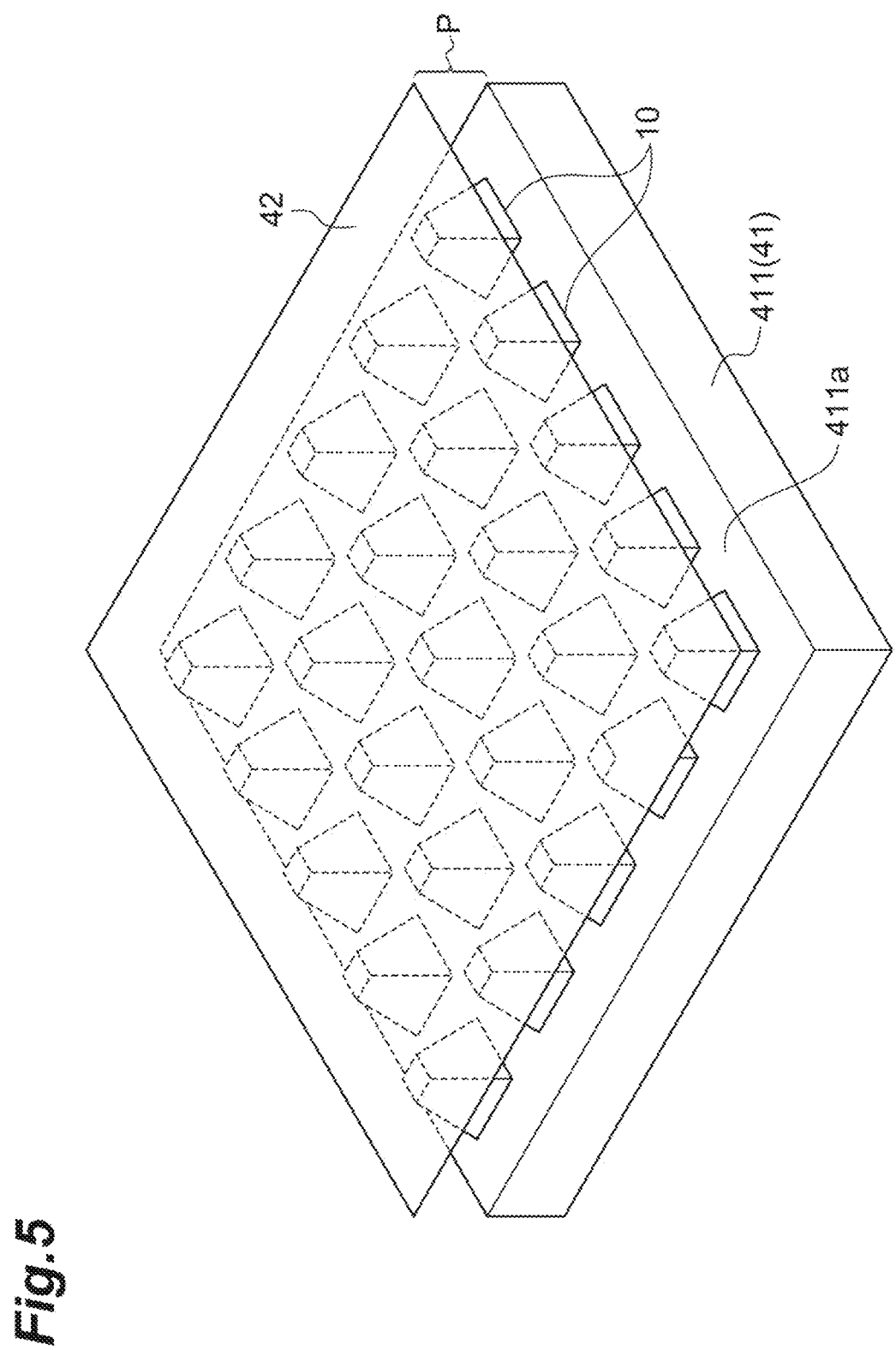
FIG. 5 is a perspective view showing a schematic configuration of a portion including the protrusion formation region of the light-emitting device shown in FIG. 1.

FIG. 5 is a perspective view showing a schematic configuration of a portion including the protrusion formation region P of the light-emitting device 4. As shown in FIG. 5, as an example, a plurality of protrusions 10 is arranged in a matrix in the protrusion formation region P in this embodiment. The protrusions 10 are, for example, in a columnar shape formed by applying a fine processing technique to the surface of the substrate 41 (i.e., the insulating layer 412). To be specific, the protrusions 10 are formed in a tapered shape (in this embodiment, a truncated pyramid shape) the cross-sectional area of which decreases as going away from the substrate member 411. For example, dry etching using CH3 or wet etching using HF or the like is performed on the insulating layer 412 included in the protrusion formation region P, so that a plurality of protrusions 10 is formed. In this case, the level of the portion of each protrusion 10 which is in contact with the graphite thin film 42 (i.e., the level of the tip surface of each protrusion 10) is flush with the level of the portion of the surface of the substrate 41 which is opposed to the graphite thin film 42 and on which the protrusions 10 are not formed (i.e., the level of the surface of the insulating layer 412 adjacent to the graphite thin film 42).

Figure 6A:
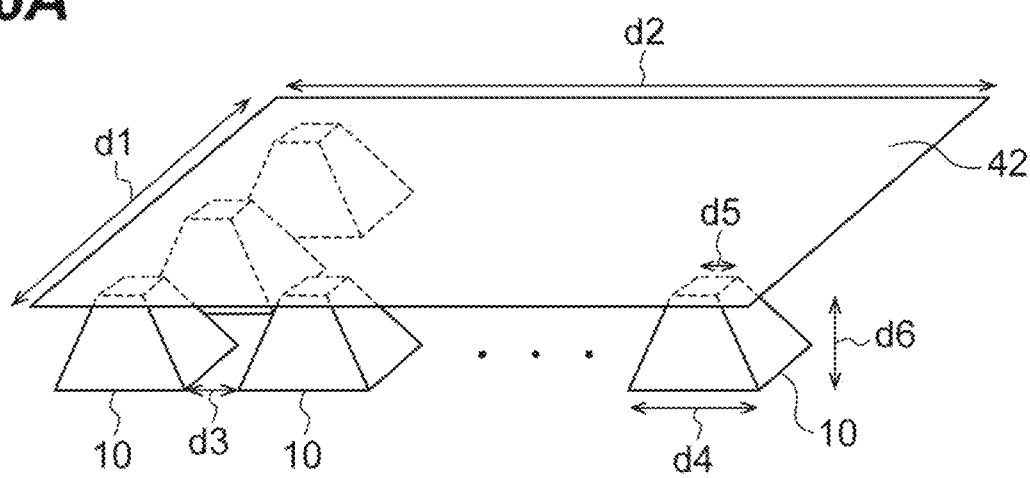
FIGS. 6A and 6B are diagrams for explaining a thermal analysis model for the light-emitting device shown in FIG. 1.
Figure 6B:
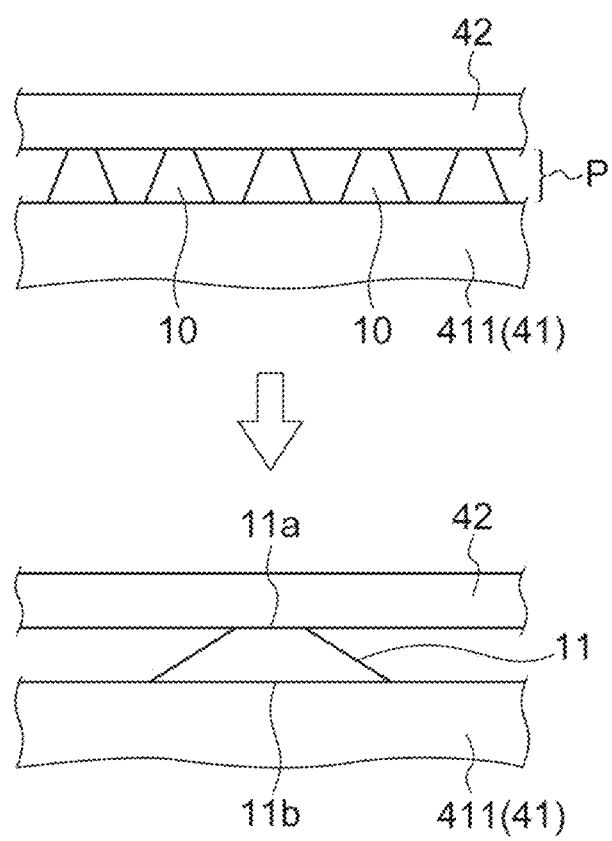

Referring to FIGS. 6A, 6B, and 7, the results of thermal analysis (simulation) showing that the thermal conduction from the graphite thin film 42 to the substrate member 411 is suppressed by the protrusion formation region P will be explained. FIG. 6A schematically shows the actual structure (pillar structure) that was used in the thermal analysis. Here, the graphite thin film 42 is a multilayer of graphene (of about 1500 layers) having a film thickness of 500 nm. The length d1 of the short side of the graphite thin film 42 is 100 μm, and the length d2 of the long side of the graphite thin film 42 is 200 μm. The graphite thin film 42 is supported by a total of 21 protrusions 10 which are composed of SiO2 (part of the insulating layer 412), in a truncated pyramid shape, and arranged in a 3 by 7 matrix. The gap d3 between the adjacent protrusions 10 is 10 μm. The shape of the bottom surface of each protrusion 10 in contact with the substrate member 411 is a square each side of which has a length d4 of 21 μm. The shape of the top surface of each protrusion 10 in contact with the graphite thin film 42 is a square each side of which has a length d5 of 1 μm. Each protrusion 10 has a height d6 of 10 μm. The inclination angle of each protrusion 10 (the angle between the bottom surface of the protrusion 10 and the side surface of the protrusion 10) is 45°. It should be noted that the height d6 is set to a value that prevents a phenomenon in which part of the graphite thin film 42 is bent and comes in contact with the substrate member 411. For this reason, depending on the shape of the protrusions 10, the height d6 is set to a higher value as the density of the protrusions 10 provided in the protrusion formation region P decreases (the gap between the protrusions 10 increases). In addition, the contact thermal resistance between each protrusion 10 and the graphite thin film 42 is $10^5$-$10^8$ W/(m$^2$·K), and the contact thermal resistance between each protrusion 10 and the substrate member 411 (i.e., the contact thermal resistance between the insulating layer 412 and the substrate member 411) is 1.25×$10^8$ W/(m$^2$·K).

FIG. 6B shows an analysis model obtained by replacing the actual structure shown in FIG. 6A so that thermal analysis is performed in an abbreviated manner. To be specific, the analysis model is a model obtained by collecting a plurality of protrusions 10 into one protrusion 11. The setting conditions (parameters) of the graphite thin film 42 during the thermal analysis are as follows.

Thermal conductivity: 1000 W/m/K
Input power: 200 mW
Emissivity: 0.8
Contact thermal resistance between the graphite thin film 42 and the protrusion 11: $10^5$ W/(m$^2$·K)
Film thickness of the graphite thin film 42: 500 nm The present inventors conducted thermal analysis under the above setting conditions in the state where the input power given to the graphite thin film 42 through the electrodes 43 was 200 mW. According to the results, as shown in FIG. 7, the highest temperature of the graphite thin film 42 reached 3094° C., while the highest temperature of the protrusion 11 was 715° C. and the lowest temperature of the protrusion 11 was 144° C. The highest temperature of the protrusion 11 was measured in the vicinity of the upper surface 11a of the protrusion 11 in contact with the graphite thin film 42, and the lowest temperature of the protrusion 11 was measured in the vicinity of the lower surface 11b of the protrusion 11 in contact with the substrate member 411. Thus, the thermal analysis showed that the structure shown in FIG. 6A (the protrusion formation region P) was effective in achieving thermal insulation between the graphite thin film 42 and the substrate member 411.

[Manufacturing Method]

Figure 8A:
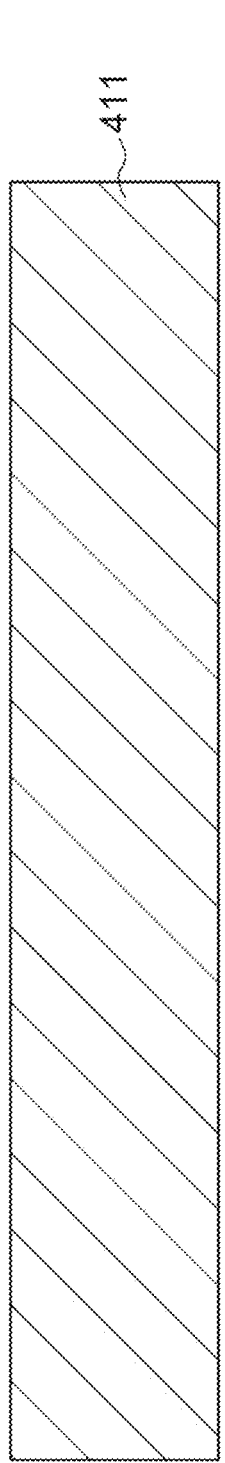
FIGS. 8A and 8B are schematic views showing a process for manufacturing the light-emitting device shown in FIG. 1.
Figure 8B:
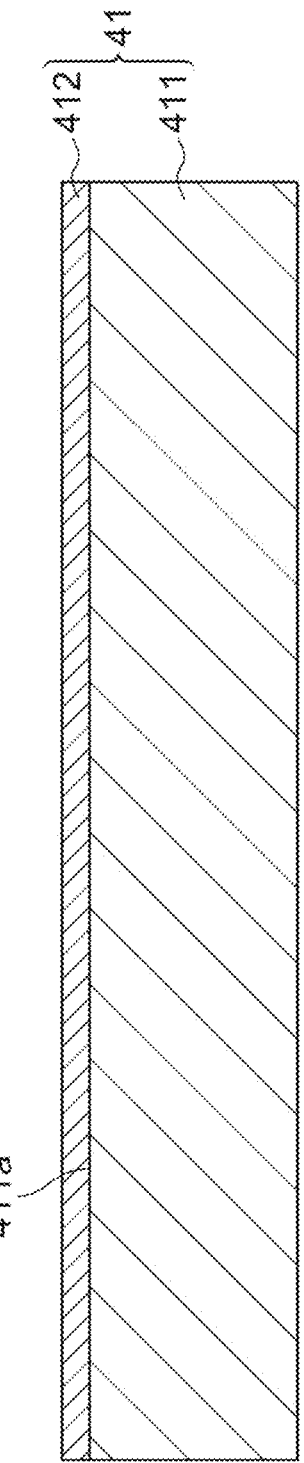

A method of manufacturing the light-emitting device 4 will now be explained. First, the substrate 41 is prepared (preparation step). The preparation step includes the step of preparing the substrate member 411 (see FIG. 8A), and the step of providing the insulating layer 412 on the surface of the substrate member 411 (FIG. 8B). In the case where the substrate member 411 is composed of Si as in this embodiment, the insulating layer 412 is coated on the surface 411a of the substrate member 411 by, for example, thermal oxidation film formation.

Next, as shown in FIG. 9A, a plurality of protrusions 10 is formed at least on a region (the protrusion formation region P) of the surface of the substrate 41 (here, the insulating layer 412) (formation step). The plurality of protrusions 10 is formed, for example, by dry etching using CH3 or wet etching using HF or the like.

Subsequently, as shown in FIG. 9B, the graphite thin film 42 is placed on the substrate 41 (placement step) so that at least the portion of the first surface 42a of the graphite thin film 42 other than the edge portions 42c and 42d of the graphite thin film 42 (the central portion) is in contact with the plurality of protrusions 10 (i.e., the protrusion formation region P). The graphite thin film 42 is placed on the substrate 41 by transfer, for example.

Subsequently, as shown in FIG. 4, on the second surface 42b of the graphite thin film 42, the electrodes 43 are formed on the edge portions 42c and 42d of the graphite thin film 42 (electrode forming step). Through the above process, the light-emitting device 4 is manufactured. Afterwards, as shown in FIG. 2, the light-emitting device 4 is fixed to the stem 3 by die bonding or the like and a unit containing the stem 3 and the light-emitting device 4 is accommodated in the package 2, thereby manufacturing the infrared light source 1.

[Acts and Effects]

In the above-described light-emitting device 4, the plurality of protrusions 10 (i.e., the protrusion formation region P) for supporting the graphite thin film 42 is formed over the entire region A1 in which the substrate 41 and the central portion of the graphite thin film 42 (the portion other than the edge portions 42c and 42d) overlap each other. The central portion of the graphite thin film 42 is supported in a plurality of locations by the plurality of protrusions 10, so that the graphite thin film 42 is stably supported with respect to the substrate 41. In addition, since the graphite thin film 42 is partially in contact with the plurality of protrusions 10, the thermal conduction from the graphite thin film 42 to the substrate 41 is suppressed. Thus, in the light-emitting device 4, the graphite thin film 42 can be stably supported while the thermal conduction from the graphite thin film 42 to the substrate 41 is suppressed. Consequently, damage to the substrate 41 due to heat can be suppressed, while high brightness is achieved by heating the graphite thin film 42. In addition, the graphite thin film 42 can be efficiently heated at low power.

Further, the protrusions 10 have insulating properties. This suppresses the leakage current from the graphite thin film 42 to the substrate (substrate member 411), thereby efficiently heating only the graphite thin film 42. It should be noted that, to obtain the above-described effects, only at least a portion of each protrusion 10 which is in contact with the graphite thin film 42 should have insulating properties and not the entire protrusion 10 should have insulating properties.

The protrusions 10 are not provided in the region A2 in which the electrodes 43 and the substrate 41 overlap each other when viewed along the thickness direction of the substrate 41 (i.e., the region in which the edge portions 42c and 42d of the graphite thin film 42 and the substrate 41 overlap each other). Since the protrusions 10 (i.e., the protrusion formation region P) are not provided in the region A2, the thermal conduction from the edge portions 42c and 42d of the graphite thin film 42 to the substrate 41 is not suppressed by the protrusions 10. Hence, the heat of the edge portions 42c and 42d of the graphite thin film 42 can be efficiently released to the substrate 41, thereby suppressing a phenomenon in which the edge portions 42c and 42d of the graphite thin film 42 reach high temperatures. Consequently, the damage to the electrodes 43 due to heat from the edge portions 42c and 42d of the graphite thin film 42 can be suppressed.

The level of the portion of each protrusion 10 which is in contact with the graphite thin film 42 (i.e., the level of the tip surface of each protrusion 10) is flush with the level of the portion of the surface of the substrate 41 which is opposed to the graphite thin film 42 and on which the protrusion 10 is not formed (i.e., the level of the surface of the insulating layer 412 adjacent to the graphite thin film 42). Accordingly, as in this embodiment, the graphite thin film 42 can be supported flat even when the graphite thin film 42 is provided across both the portion in which the protrusions 10 are formed (the region A1) and the portion in which the protrusions 10 are not formed (the region A2). This suppresses the warpage of the graphite thin film 42 and the damage to the graphite thin film 42.

The substrate 41 includes the substrate member 411 and the insulating layer 412 provided on the surface 411a of the substrate member 411 which is opposed to the graphite thin film 42, and the protrusions 10 are formed on the insulating layer 412. With this configuration, the protrusions 10 can be formed by performing fine processing (e.g., the above-mentioned dry etching, wet etching, or the like) on the insulating layer 412 provided on the substrate member 411. In particular, the substrate member 411 is composed of silicon, and the insulating layer 412 is composed of silicon dioxide. Accordingly, the fine processing of silicon dioxide (the insulating layer 412) formed on the surface of silicon (the substrate member 411) allows the protrusions 10 to be formed in a relatively easy process.

The contact area between the protrusions 10 and the graphite thin film 42 is smaller than the contact area between the protrusions 10 and the substrate member 411. To be specific, the protrusions 10 are formed in a tapered shape (in this embodiment, a truncated pyramid shape) the cross-sectional area of which decreases as going away from the substrate member 411. Here, the larger the contact area between the protrusions 10 and the substrate member 411, the more stably the protrusions 10 can be supported with respect to the substrate member 411. Further, the smaller the contact area between the protrusions 10 and the graphite thin film 42, the more the thermal conduction from the graphite thin film 42 to the protrusions 10 can be suppressed and the more effectively the thermal conduction to the substrate member 411 through the protrusions 10 can be suppressed.

The protrusions 10 have a columnar shape. The plurality of columnar protrusions 10 enables a structure in which the graphite thin film 42 is supported partially and stably in a plurality of locations.

The graphite thin film 42 has a rectangular shape when viewed along the thickness direction of the substrate 41, and the length of the long side of the graphite thin film 42 is greater than or equal to 100 μm. In this embodiment, the length of the short side of the graphite thin film 42 is greater than or equal to 50 μm. The graphite thin film 42 is very thin and flexible. For this reason, for example, as described in Patent Literature 2, when a crosslinked structure for supporting two points at the both ends of the long graphite thin film 42 described above is employed, the central portion of the graphite thin film 42 is largely bent and may thus be damaged. On the other hand, in the light-emitting device 4, the graphite thin film 42 is supported in a plurality of locations by the plurality of protrusions 10, thereby suppressing the damage to the graphite thin film 42 which may occur when the above-described crosslinked structure is employed. Thus, the graphite thin film 42 can be made long. Further, use of the long graphite thin film 42 the long side of which has a length of greater than or equal to 100 μm improves flexibility in the design of the light-emitting device 4.

Further, the infrared light source 1 includes the light-emitting device 4 having the above-mentioned advantageous effects. Thus, with the infrared light source 1, in the light-emitting device 4, the graphite thin film 42 can be stably supported while the thermal conduction from the graphite thin film 42 to the substrate 41 is suppressed.

In addition, in the above-described method of manufacturing the light-emitting device 4, a plurality of protrusions is formed at least on a region (the region corresponding to the protrusion formation region P) of the surface of the substrate 41 (here, the insulating layer 412), thereby attaining a structure in which the central portion of the graphite thin film 42 (the portion other than the edge portions 42c and 42d) is in contact with the plurality of protrusions 10. Since the central portion of the graphite thin film 42 is supported in a plurality of locations by the plurality of protrusions 10 in this way, the graphite thin film 42 is stably supported with respect to the substrate 41. In addition, since the graphite thin film 42 is partially in contact with the plurality of protrusions 10, the thermal conduction from the graphite thin film 42 to the substrate 41 is suppressed. Thus, the method of manufacturing the light-emitting device 4 produces the light-emitting device 4 in which the graphite thin film 42 can be stably supported while the thermal conduction from the graphite thin film 42 to the substrate 41 is suppressed.

In the above-described manufacturing method, the preparation step includes the step of preparing the substrate member 411, and the step of providing the insulating layer 412 on the surface 411a of the substrate member 411. Further, in the formation step, the plurality of protrusions 10 is formed by etching at least a region of the insulating layer 412 (the region corresponding to the protrusion formation region P). Accordingly, the plurality of protrusions 10 can be formed by a relatively easy process, i.e., etching of the insulating layer 412 provided on the surface of the substrate member 411.

[Modification 1]

Figure 10A:
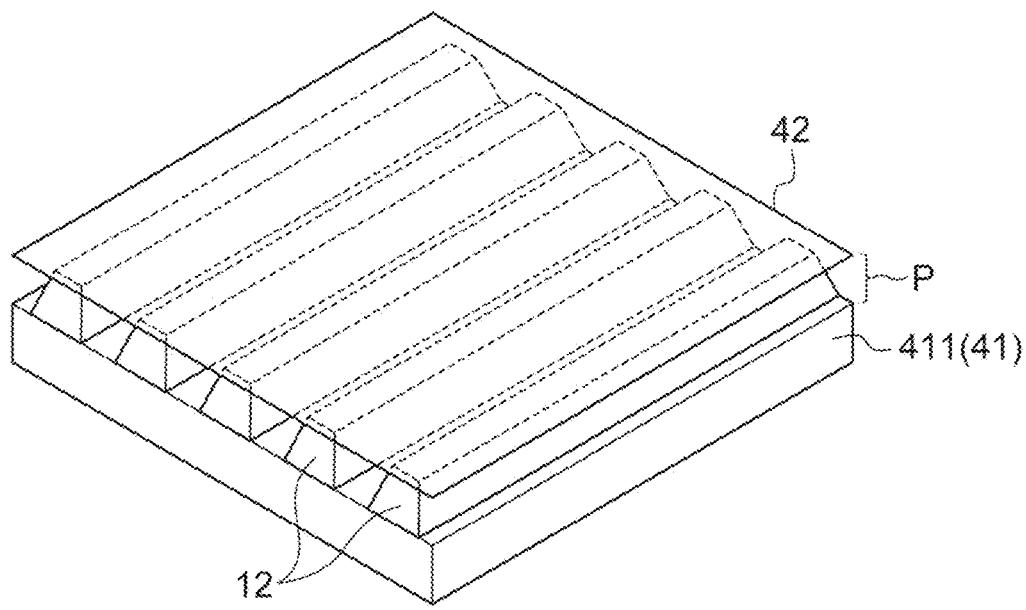
FIGS. 10A and 10B are schematic views showing a modification of the first embodiment.

As shown in FIG. 10A, a plurality of protrusions formed in the protrusion formation region P may be a plurality of walls 12 arranged in one direction. In other words, in the protrusion formation region P, the plurality of walls 12 may be formed into a so-called line and space pattern instead of the above-described columnar (specifically, truncated pyramid) protrusions 10. Like the above-described protrusions 10, these walls 12 can be formed by etching the insulating layer 412. In this case, the graphite thin film 42 can be supported more stably while the thermal conduction from the graphite thin film 42 to the substrate 41 (especially the substrate member 411) is suppressed by partially supporting the graphite thin film 42 with the plurality of walls 12.

In addition, the plurality of protrusions formed in the protrusion formation region P may be a plurality of walls in a matrix (mesh) pattern. To be specific, in FIG. 10A, a plurality of walls (hereinafter referred to as "second walls") may be further provided which extends in a direction intersecting the direction in which the walls 12 extend. In this case, at the intersection of each of the plurality of the second walls and each of the plurality of walls 12, each second wall and each wall 12 are connected to each other. Adoption of a matrix pattern, which requires relatively easy processing, allows the plurality of protrusions to be formed in an easy process. In addition, the walls serving as the protrusions do not necessarily extend in one direction as described above and may be formed into, for example, a curved pattern or spiral pattern.

[Modification 2]

Figure 10B:
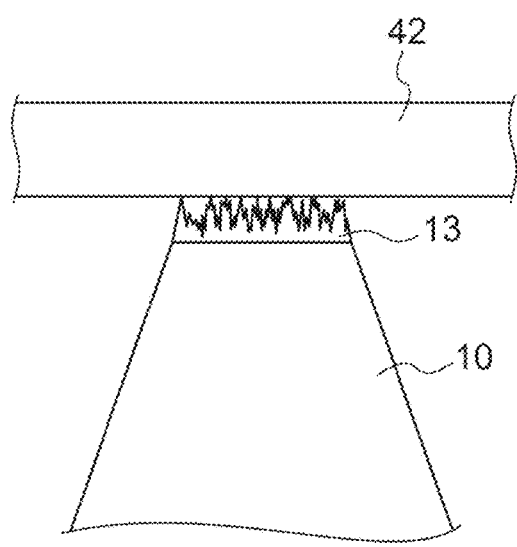

As shown in FIG. 10B, the surface of each protrusion 10 which is opposed to the graphite thin film 42 may have a fine structure portion 13 having a fine uneven structure. Such a fine structure portion 13 can be formed by surface treatment on the surface of the protrusion 10. Examples of the surface treatment include treatment for roughening the surface of the protrusion 10 by etching in the fineness of about the atomic order to 1 nm order, and coating with a material having a rough surface (e.g., porous materials, such as porous silica and porous alumina). With this configuration, the fine structure portion 13 formed on the surface of the protrusion 10 leads to a further reduction in the contact area between the graphite thin film 42 and the protrusion 10, thereby suppressing the thermal conduction from the graphite thin film 42 to the substrate 41 more effectively. It should be noted that the fine structure portion 13 can also be formed on the surface of protrusions having shapes different from that of the protrusion 10 (e.g., the above-described wall 12 and the second wall).

[Another Modification]

Although the protrusion formation region P is formed outside the region A2 in the above-described light emitting device 4, the protrusion formation region P may be also formed in the region A2 if, for example, there is no risk of damage to the electrodes 43 due to heat from the graphite thin film 42 or the thermal conduction from the graphite thin film 42 to the substrate 41 needs to rather be suppressed more effectively. In other words, the plurality of protrusions 10 may be provided in the region in which the graphite thin film 42 and the substrate 41 overlap each other when viewed along the thickness direction of the substrate 41 (the combined region of the region A1 and the region A2 shown in FIG. 4). In this case, thermal insulation between the graphite thin film 42 and the substrate 41 can be achieved over the entire area of the first surface 42a of the graphite thin film 42. Thus, the thermal conduction from the graphite thin film 42 to the substrate 41 can be more effectively suppressed, allowing the graphite thin film 42 to be efficiently heated.

Second Embodiment

Figure 11A:
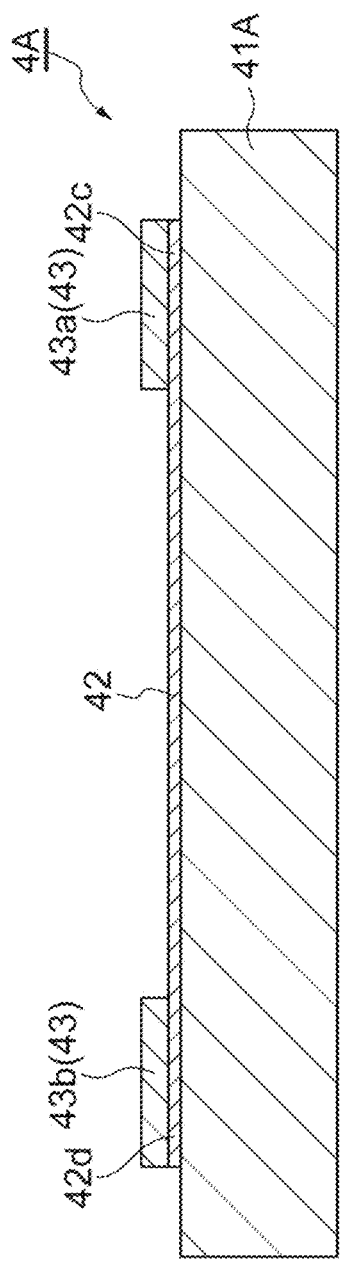
FIGS. 11A and 11B are schematic views showing a light-emitting device according to the second embodiment.
Figure 11B:
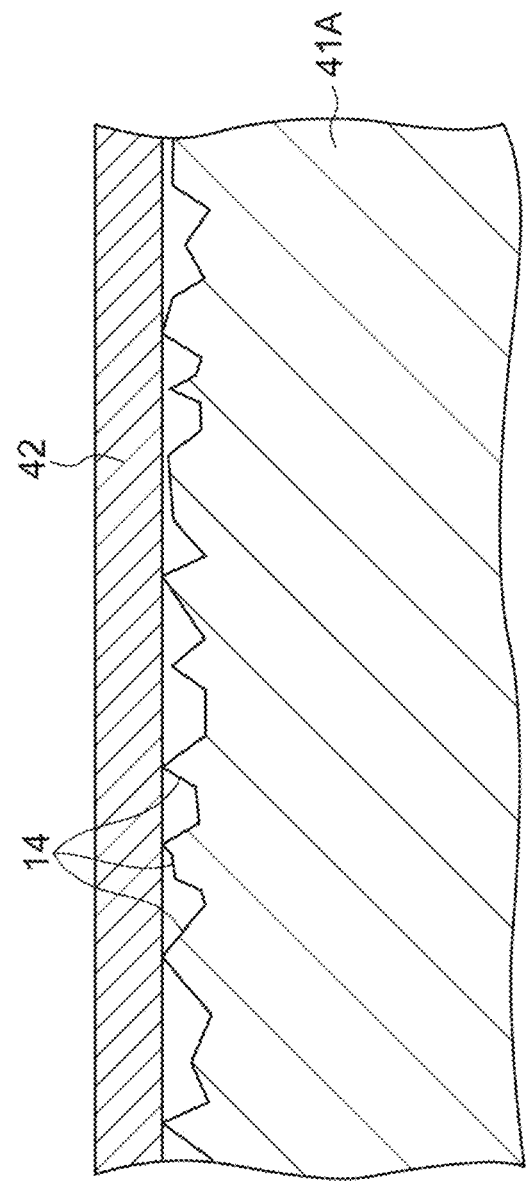

FIGS. 11A and 11B show a light-emitting device 4A according to the second embodiment. FIG. 11A shows the cross section of the entire light-emitting device 4A. FIG. 11B shows the enlarged contact area between the graphite thin film 42 and the substrate 41A. The light-emitting device 4A has the same configuration as the light-emitting device 4 except that it includes a substrate 41A instead of the substrate 41. As shown in FIG. 11B, a plurality of protrusions 14 for supporting the graphite thin film 42 is formed on the surface of the substrate 41A which is opposed to the graphite thin film 42, at least over the entire region in which the substrate 41A and the portion of the graphite thin film 42 other than the edge portions 42c and 42d overlap each other when viewed along the thickness direction of the substrate 41A. The plurality of protrusions 14 has an uneven structure of the fineness of, for example, about the atomic order to 1 nm order. Such an uneven structure can be formed, for example, by roughening the surface of the substrate 41A by etching in the fineness of about the atomic order to 1 nm order. This etching is treatment similar to "treatment for roughening the surface of the protrusion 10 by etching in the fineness of about the atomic order to 1 nm order" in Modification 2 of the above-described first embodiment.

As described above, the same effects as those of the plurality of protrusions 10 of the first embodiment described above can be obtained even when an uneven structure of the fineness of about the atomic order to 1 nm order (a plurality of protrusions 14) is formed on the surface of the substrate 41A without forming protrusions having a columnar shape, a wall shape, or the like described in the first embodiment. In other words, since at least the central portion of the graphite thin film 42 (the portion other than the edge portions 42c and 42d) is supported in a plurality of locations by the tips of the plurality of protrusions 14, the graphite thin film 42 is stably supported with respect to the substrate 41A. In addition, since the graphite thin film 42 is partially in contact with the plurality of protrusions 14, the thermal conduction from the graphite thin film 42 to the substrate 41A is suppressed. Thus, in the light-emitting device 4A, the graphite thin film 42 can be stably supported while the thermal conduction from the graphite thin film 42 to the substrate 41A is suppressed. It should be noted that the substrate 41A may be a member consisting only of the substrate member 411 of the first embodiment, or may be a member in which the insulating layer 412 is formed on the surface of the substrate member 411. In the former case, the plurality of protrusions 14 is formed on the surface of the substrate member 411. In the latter case, the plurality of protrusions 14 is formed on the surface of the insulating layer 412.

Third Embodiment

Figure 12A:
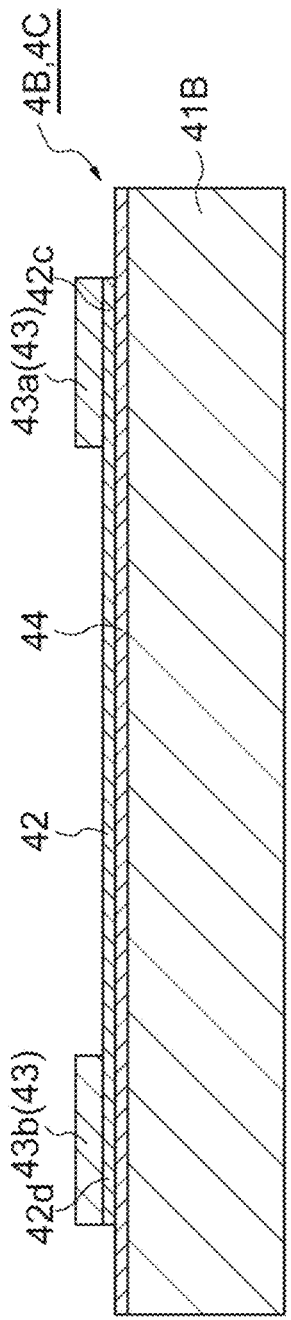
FIGS. 12A, 12B, and 12C are schematic views showing light-emitting devices according to the third and fourth embodiments.
Figure 12B:
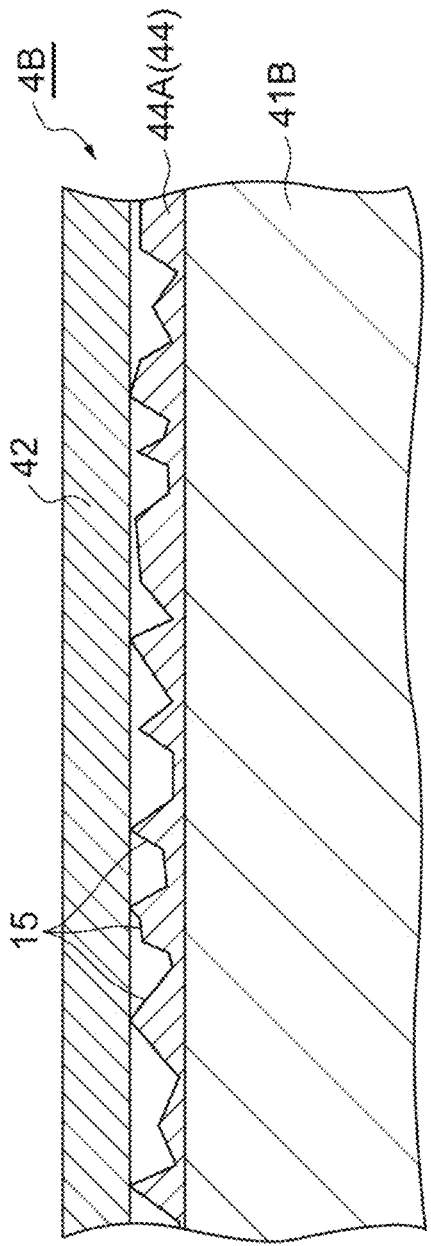

FIGS. 12A and 12B show a light-emitting device 4B according to the third embodiment. FIG. 12A shows the cross section of the entire light-emitting device 4B or 4C. FIG. 12B shows the enlarged contact area between the graphite thin film 42 and a covering layer 44A. The light-emitting device 4B has the same configuration as the light-emitting device 4 except that it includes a substrate 41B and the covering layer 44A, which is provided on the surface of the substrate 41B opposed to the graphite thin film 42, instead of the substrate 41. The substrate 41B may be a member consisting only of the substrate member 411 of the first embodiment, or may be a member in which the insulating layer 412 is formed on the surface of the substrate member 411. The substrate 41B is the same as the substrate 41A of the second embodiment except that it is not etched for roughening the surface.

The covering layer 44A is formed by coating a material having a rough surface (e.g., a porous material such as porous silica or porous alumina) on the surface of the substrate 41B. The covering layer 44A is formed on the surface of the substrate 41B which is opposed to the graphite thin film 42, at least on the region in which the substrate 41B and the portion of the graphite thin film 42 other than the edge portions 42c and 42d overlap each other when viewed along the thickness direction of the substrate 41B. Although the covering layer 44A is provided on the entire surface of the substrate 41B as an example in this embodiment, the covering layer 44A may be provided, for example, only directly below the central portion of the graphite thin film 42 (the portion other than the edge portions 42c and 42d). In this case, the level of the central portion of the graphite thin film 42 may be higher than the level of the edge portions 42c and 42d by the height of the covering layer 44A. In other words, the central portion of the graphite thin film 42 may be raised compared with the edge portions 42c and 42d.

A plurality of protrusions 15 is formed on the surface of the covering layer 44A. At least the central portion of the graphite thin film 42 (the portion other than the edge portions 42c and 42d) is supported in a plurality of locations by the tips of the plurality of protrusions 15, so that the graphite thin film 42 is stably supported with respect to the substrate 41B. In addition, since the graphite thin film 42 is partially in contact with the plurality of protrusions 15, the thermal conduction from the graphite thin film 42 to the substrate 41B is suppressed. Thus, in the light-emitting device 4B, the graphite thin film 42 can be stably supported while the thermal conduction from the graphite thin film 42 to the substrate 41B is suppressed.

Fourth Embodiment

Figure 12C:
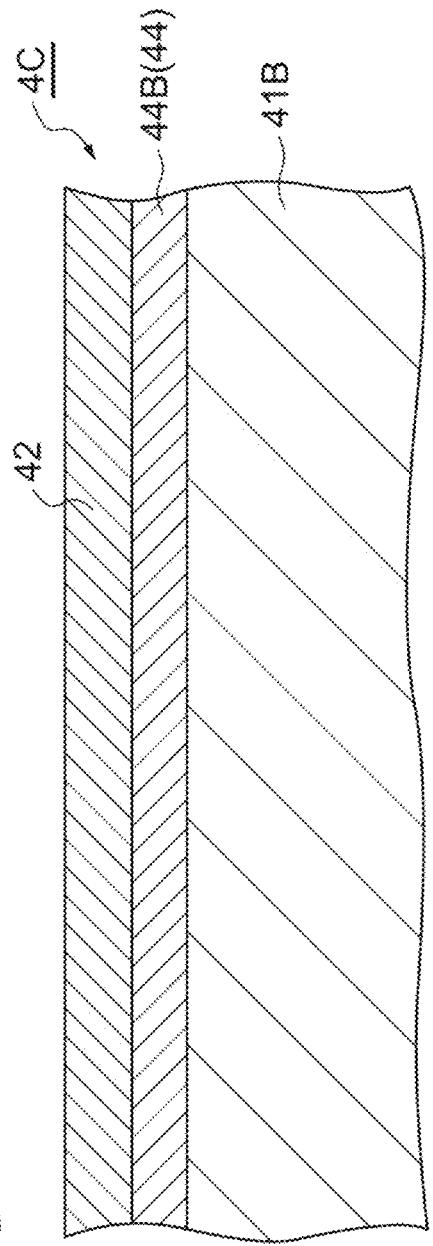

FIGS. 12A and 12C show a light-emitting device 4C according to the fourth embodiment. FIG. 12C shows the enlarged contact area between the graphite thin film 42 and a covering layer 44B. The light-emitting device 4C has the same configuration as the light-emitting device 4B except that it includes a covering layer 44B instead of the covering layer 44A.

The covering layer 44B has a porous structure in which many pores (holes) are formed. The material for the covering layer 44B is, for example, an oxide with low thermal conductivity. Specific examples of such a material include spin on glass (SOG) added with a low-k material. The covering layer 44B is formed on the surface of the substrate 41B which is opposed to the graphite thin film 42, at least on the region in which the substrate 41B and the portion of the graphite thin film 42 other than the edge portions 42c and 42d overlap each other when viewed along the thickness direction of the substrate 41B. Although the covering layer 44B is provided on the entire surface of the substrate 41B as an example in this embodiment, the covering layer 44B may be provided, for example, only directly below the central portion of the graphite thin film 42 (the portion other than the edge portions 42c and 42d). In this case, the level of the central portion of the graphite thin film 42 may be higher than the level of the edge portions 42c and 42d by the height of the covering layer 44B. In other words, the central portion of the graphite thin film 42 may be raised compared with the edge portions 42c and 42d.

In the light-emitting device 4C, at least the central portion of the graphite thin film 42 (the portion other than the edge portions 42c and 42d) is supported by the covering layer 44B. Thus, the graphite thin film 42 is stably supported with respect to the substrate 41B. In addition, the covering layer 44B has a porous structure, so that the thermal conduction from the graphite thin film 42 to the substrate 41B through the covering layer 44B is suppressed. To be specific, the covering layer 44B contains many pores and thus has relatively low thermal conductivity. Thus, in the light-emitting device 4C, the graphite thin film 42 can be stably supported while the thermal conduction from the graphite thin film 42 to the substrate 41B is suppressed.

The light-emitting device 4C can be manufactured in the following manner. In particular, instead of the formation step in the method of manufacturing the light-emitting device 4, a covering layer forming step in which the covering layer 44B having a porous structure is formed is performed for at least a region of the surface of the substrate 41B (the region corresponding to the central portion of the graphite thin film 42 (the portion other than the edge portions 42c and 42d)). In addition, instead of the placement step in the method of manufacturing the light-emitting device 4, a placement step is performed in which the graphite thin film 42 is disposed on the covering layer 44B so that the covering layer 44B overlaps at least the portion of the first surface 42a of the graphite thin film 42 other than the edge portions 42c and 42d of the graphite thin film 42 when viewed along the thickness direction of the substrate 41B.

In this method of manufacturing the light-emitting device 4C, the covering layer 44B having a porous structure is formed at least on a region of the surface of the substrate 41B, thereby attaining a structure in which the central portion of the graphite thin film 42 (the portion other than the edge portions 42c and 42d) is in contact with the covering layer 44B. Since the central portion of the graphite thin film 42 is supported by the covering layer 44B in this way, the graphite thin film 42 is stably supported with respect to the substrate 41B. In addition, the covering layer 44B has a porous structure, so that the thermal conduction from the graphite thin film 42 to the substrate 41B through the covering layer 44B is suppressed. Thus, the method of manufacturing the light-emitting device 4C produces the light-emitting device 4C in which the graphite thin film 42 can be stably supported while the thermal conduction from the graphite thin film 42 to the substrate 41B is suppressed.

Although the embodiments of the present invention have been described so far, the present invention is not limited to the aforementioned embodiments and various modifications of the present invention can be made without departing from the scope of the present invention. For example, the infrared light source 1 may include any of the light-emitting devices 4A, 4B, and 4C instead of the light-emitting device 4. Use of any of the light-emitting devices 4A, 4B, and 4C provides an infrared light source in which the graphite thin film 42 can be stably supported while the thermal conduction from the graphite thin film 42 to the substrate is suppressed. In other words, provided is an infrared light source for which the graphite thin film 42 can be efficiently heated and high brightness can be achieved.

What is claimed is:

1. A light-emitting device comprising:
   a substrate;
   a graphite thin film disposed on the substrate; and
   an electrode provided on a second surface of the graphite thin film on an edge portion of the graphite thin film, the second surface of the graphite thin film being opposite from a first surface of the graphite thin film, the first surface of the graphite thin film opposed to the substrate, wherein
   a plurality of protrusions for partially supporting the graphite thin film is formed on a surface of the substrate opposed to the graphite thin film, at least over an entire region where the substrate and a portion of the graphite thin film other than the edge portion overlap each other when viewed along a thickness direction of the substrate,
   wherein the graphite thin film is supported by respective top portions of the plurality of protrusions, without being supported by respective spaces formed between the plurality of protrusions.

2. The light-emitting device according to claim 1, wherein a portion of each protrusion in contact with the graphite thin film has insulating properties.

3. The light-emitting device according to claim 1, wherein the protrusions are provided in a region where the substrate and the graphite thin film overlap each other when viewed along the thickness direction of the substrate.

4. The light-emitting device according to claim 1, wherein the protrusions are not provided in a region where the substrate and the electrode overlap each other when viewed along the thickness direction of the substrate.

5. The light-emitting device according to claim 1, wherein a level of a portion of each protrusion in contact with the graphite thin film is flush with a level of a portion of the substrate where the protrusions are not formed.

6. The light-emitting device according to claim 1, wherein the substrate includes a substrate member and an insulating layer provided on a surface of the substrate member opposed to the graphite thin film, and the protrusions are formed on the insulating layer.

7. The light-emitting device according to claim 6, wherein the substrate member is composed of silicon, and the insulating layer is composed of silicon dioxide.

8. The light-emitting device according to claim 6, wherein a contact area between the protrusions and the graphite thin film is smaller than a contact area between the protrusions and the substrate member.

9. The light-emitting device according to claim 1, wherein each protrusion has a columnar shape.

10. The light-emitting device according to claim 1, wherein the plurality of protrusions includes a plurality of walls arranged in one direction.

11. The light-emitting device according to claim 1, wherein a surface of each protrusion opposed to the graphite thin film has a fine structure portion having a fine uneven structure.

12. The light-emitting device according to claim 1, wherein the graphite thin film is a single layer or multilayer of graphene.

13. The light-emitting device according to claim 12, wherein the graphite thin film is a multilayer of graphene with 100 to 2000 layers.

14. The light-emitting device according to claim 1, wherein
   the graphite thin film has a rectangular shape when viewed along the thickness direction of the substrate, and a long side of the graphite thin film has a length of greater than or equal to 100 m.

15. A light-emitting device comprising:
a substrate;
a graphite thin film disposed on the substrate;
an electrode provided on a second surface of the graphite thin film on an edge portion of the graphite thin film, the second surface of the graphite thin film being opposite from a first surface of the graphite thin film, the first surface of the graphite thin film opposed to the substrate; and
a covering layer having a porous structure, the covering layer being provided on a surface of the substrate opposed to the graphite thin film, at least on a region where the substrate and a portion of the graphite thin film other than the edge portion overlap each other when viewed along a thickness direction of the substrate.

16. An infrared light source comprising:
a package including a light transmitting window and defining an internal space held in a vacuum state;
a stem disposed in the package; and
the light-emitting device according to claim 1 disposed on the stem, wherein
light emitted from the graphite thin film is emitted to the outside of the package through the light transmitting window.

17. An infrared light source comprising:
a package including a light transmitting window and defining an internal space held in a vacuum state;
a stem disposed in the package; and
the light-emitting device according to claim 15 disposed on the stem, wherein
light emitted from the graphite thin film is emitted to the outside of the package through the light transmitting window.

18. A method for manufacturing a light-emitting device, comprising:
a preparation step of preparing a substrate;
a formation step of forming a plurality of protrusions at least on a region of a surface of the substrate;
a placement step of disposing a graphite thin film on the substrate in such a manner that at least a portion of a first surface of the graphite thin film other than an edge portion of the graphite thin film comes in contact with respective top portions of the plurality of protrusions such that the graphite thin film is not supported by respective spaces formed between the plurality of protrusions; and
an electrode forming step of forming an electrode on a second surface of the graphite thin film opposite from the first surface, on the edge portion of the graphite thin film.

19. The method for manufacturing a light-emitting device according to claim 18, wherein
the preparation step includes a step of preparing a substrate member, and a step of providing an insulating layer on a surface of the substrate member, and
in the formation step, the plurality of protrusions is formed by etching at least a region of the insulating layer.

20. A method for manufacturing a light-emitting device, comprising:
a preparation step of preparing a substrate;
a covering layer forming step of forming a covering layer at least on a region of a surface of the substrate, the covering layer having a porous structure;
a placement step of disposing a graphite thin film on the covering layer in such a manner that the covering layer and at least a portion of a first surface of the graphite thin film other than an edge portion of the graphite thin film overlap each other; and
an electrode forming step of forming an electrode on a second surface of the graphite thin film opposite from the first surface, on the edge portion of the graphite thin film.

* * * * *